United States Patent
Lee et al.

(10) Patent No.: US 9,634,290 B2
(45) Date of Patent: Apr. 25, 2017

(54) LAMINATE FOR LIGHT EMITTING DEVICE AND PROCESS OF PREPARING SAME

(71) Applicant: SAINT-GOBAIN GLASS FRANCE, Courbevoie (FR)

(72) Inventors: Young-Seong Lee, Seoul (KR); Jin-Woo Han, Seoul (KR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 15/027,383

(22) PCT Filed: Oct. 7, 2014

(86) PCT No.: PCT/KR2014/009420
§ 371 (c)(1),
(2) Date: Apr. 5, 2016

(87) PCT Pub. No.: WO2015/053529
PCT Pub. Date: Apr. 16, 2015

(65) Prior Publication Data
US 2016/0248047 A1    Aug. 25, 2016

(30) Foreign Application Priority Data
Oct. 8, 2013 (KR) .................. 10-2013-0119830

(51) Int. Cl.
*H01L 51/52* (2006.01)
*H05B 33/02* (2006.01)
(Continued)

(52) U.S. Cl.
CPC .......... *H01L 51/5275* (2013.01); *C03B 23/20* (2013.01); *F21K 9/50* (2013.01);
(Continued)

(58) Field of Classification Search
CPC ............. H01L 51/5275; H01L 51/5271; H01L 51/5206; H01L 51/5234; H01L 51/5253;
(Continued)

(56) References Cited

U.S. PATENT DOCUMENTS 5,776,884 A    7/1998 Martin
5,780,371 A    7/1998 Rifqi et al.
(Continued)

FOREIGN PATENT DOCUMENTS

CN    1899696 A    1/2007
CN    103000817 A    3/2013
(Continued)

OTHER PUBLICATIONS

International Search Report as issued in International Patent Application No. PCT/KR2014/009420, dated Jan. 21, 2015.
(Continued)

*Primary Examiner* — Donald Raleigh
(74) *Attorney, Agent, or Firm* — Pillsbury Winthrop Shaw Pittman LLP

(57) ABSTRACT

A laminate for a light emitting device, includes a glass substrate, a random network of reliefs formed on the glass substrate, and a flattening layer formed on the network, wherein the network of reliefs are formed from a glass frit. The laminate for a light emitting device further includes a network inducing the scattering of light for efficiently extracting outward a loss of light at an interface between a glass substrate and an internal light extraction layer. The laminate is suitable for the industrial field of optical devices, such as organic light emitting diodes (OLEDs), backlights, lighting, and the like.

28 Claims, 6 Drawing Sheets

(51) Int. Cl.
  *H05B 33/10* (2006.01)
  *H01L 51/00* (2006.01)
  *C03B 23/20* (2006.01)
  *F21K 99/00* (2016.01)
  *F21K 9/90* (2016.01)
  *F21V 5/00* (2015.01)

(52) U.S. Cl.
  CPC ............ *F21K 9/90* (2013.01); *F21V 5/002* (2013.01); *H01L 51/0096* (2013.01); *H01L 51/5206* (2013.01); *H01L 51/5234* (2013.01); *H01L 51/5253* (2013.01); *H01L 51/5268* (2013.01); *H01L 51/5271* (2013.01); *H01L 2251/303* (2013.01); *H01L 2251/558* (2013.01); *Y02E 10/549* (2013.01)

(58) Field of Classification Search
  CPC ............ H01L 51/5268; H01L 51/0096; H01L 2251/558; H01L 2251/303; F21V 5/002; C03B 23/20; F21K 9/50; F21K 9/90; Y02E 10/549
  See application file for complete search history.

(56) References Cited

U.S. PATENT DOCUMENTS

| | | | |
|---|---|---|---|
| 6,905,991 | B1 | 6/2005 | El Khiati et al. |
| 8,368,064 | B2 | 2/2013 | Wada et al. |
| 8,427,045 | B2 | 4/2013 | Nakamura et al. |
| 8,431,943 | B2 | 4/2013 | Nakamura et al. |
| 8,729,593 | B2 | 5/2014 | Nakamura et al. |
| 9,206,074 | B2 | 12/2015 | Yanase et al. |
| 2007/0179039 | A1 | 8/2007 | El Khiati et al. |
| 2011/0001159 | A1 | 1/2011 | Nakamura et al. |
| 2011/0278635 | A1 | 11/2011 | Nakamura et al. |
| 2012/0155093 | A1 | 6/2012 | Yamada et al. |
| 2013/0186467 | A1 | 7/2013 | Saeki et al. |
| 2013/0264555 | A1 | 10/2013 | Ishibashi et al. |
| 2014/0234583 | A1 | 8/2014 | Ryu et al. |
| 2015/0014668 | A1 | 1/2015 | Dobbertin et al. |
| 2016/0020416 | A1 | 1/2016 | Guimard et al. |
| 2016/0155990 | A1* | 6/2016 | Han .................. H05B 33/22 428/312.6 |

FOREIGN PATENT DOCUMENTS

| | | |
|---|---|---|
| JP | H05-65478 A | 3/1993 |
| JP | 2007-287486 A | 11/2007 |
| JP | 2013-025900 A | 2/2013 |
| JP | 2013-114802 A | 6/2013 |
| KR | 10-0483010 B1 | 8/2005 |
| KR | 10-2010-0051631 A | 5/2010 |
| KR | 10-2010-0101076 A | 9/2010 |
| KR | 10-2010-0106413 A | 10/2010 |
| KR | 10-2010-0131074 A | 12/2010 |
| KR | 10-2010-0138939 A | 12/2010 |
| KR | 10-2011-0108373 A | 10/2011 |
| KR | 10-2011-0113177 A | 10/2011 |
| KR | 10-2011-0116142 A | 10/2011 |
| KR | 10-2012-0069575 A | 6/2012 |
| KR | 10-2013-0009704 A | 1/2013 |
| TW | 201228977 A1 | 7/2012 |
| TW | 201318962 A1 | 5/2013 |
| WO | WO 02/37568 A1 | 5/2002 |
| WO | WO 2010/058755 A1 | 5/2010 |
| WO | WO 2010/077521 A2 | 7/2010 |
| WO | WO 2012/043828 A1 | 4/2012 |
| WO | WO 2012/086396 A1 | 6/2012 |
| WO | WO 2012/125321 A2 | 9/2012 |
| WO | WO 2013/102530 A1 | 7/2013 |
| WO | WO 2014/135817 A1 | 9/2014 |

OTHER PUBLICATIONS

International Preliminary Report on Patentability as issued in International Patent Application No. PCT/KR2014/009420, dated Apr. 12, 2016.

Chinese Office Action as issued in Chinese Patent Application No. 201480040327.X, dated Nov. 15, 2016.

* cited by examiner a. Porous glass frit structure     b. Random network of reliefs     c. Densified structure (a)

(b)

(c)

(a)

(b)

LAMINATE FOR LIGHT EMITTING DEVICE AND PROCESS OF PREPARING SAME

CROSS-REFERENCE TO RELATED APPLICATIONS

This application is the U.S. National Stage of PCT/KR2014/009420, filed Oct. 7, 2014, which in turn claims priority to Korean Application No. 10-2013-0119830, filed Oct. 8, 2013. The contents of all of these applications are incorporated herein by reference in their entirety.

TECHNICAL FIELD

The present invention relates to a laminate for a light emitting device and a process for preparing the same, for enhancing external light efficiency by minimizing a loss of light at an interface between a glass substrate and an internal light extraction layer. The laminate for a light emitting device of the present invention is particularly suitable in the industrial fields of optical devices, such as organic light emitting diodes (OLEDs), backlights, lighting, and the like.

BACKGROUND

Optical devices, for example, OLEDs, may be categorized into a bottom emission structure in which light is emitted toward a glass substrate, and a top emission structure in which light is emitted in a direction opposite to a glass substrate, depending on the emission structure. In the bottom emission structure, a cathode acts as a reflector by using a metal thin film of aluminum or the like, and an anode acts as a path, through which light is emitted, by using a transparent oxide conductive film of indium tin oxide (ITO) or the like. In the top emission structure, a cathode is formed as a multi-layered thin film including a very thin silver thin film, and light is emitted through the cathode. In the field of lighting panels, except for transparent panels in which light is emitted through both surfaces, the bottom emission structure is generally used, with the top emission structure being rarely used.

In a laminate used for an optical device, such as an OLED, only about 20% of emitted light is emitted to the outside, and about 80% of the emitted light is lost. There are two grounds for the loss of light: (1) a wave-guiding effect due to a difference in refractive indexes among a glass substrate, a transparent electrode and an organic layer, and (2) a total reflection effect due to a difference in refractive indexes between the glass substrate and air.

This is because a planar waveguide is naturally formed in the OLED due to conditions wherein a refractive index of an internal organic layer is about 1.7 to 1.8, a refractive index of ITO generally used as a transparent electrode is about 1.9, a thickness of the two layers is about 200 nm to 400 nm (very thin), and a refractive index of the glass used as a substrate is about 1.5. Calculation shows that an amount of light lost by the wave-guiding effect is about 45% of the emitted light.

Light extraction technology is progressively drawing much attention as a core technology that increases efficiency, luminance, and service life of optical devices. Technology of extracting light isolated between an organic layer and electrode is called the internal light extraction technology.

According to reported research, an internal light scattering layer, deformation of a substrate surface, a refractive index adjustment layer, photonic crystals, a nanostructure forming method, etc., are known to be effective on extraction of internal light. A main objective of the internal light extraction technology is to scatter, diffract, or refract the light isolated due to the wave-guiding effect in order to form an incident angle less than or equal to the critical angle, thereby extracting light to the outside of an optical waveguide.

Patent Document 1 discloses an internal light extraction layer having a structure wherein light scattering nanoparticles are applied on a substrate of low refractive index with one-dimensionally or two-dimensionally periodical structures formed thereon, and a flattening layer of high refractive index is then applied thereto.

Patent Document 2 discloses an internal light extraction layer having a structure wherein a layer having periodical nanostructures is formed on a substrate of low refractive index by using a printing process, such as imprinting (an additional scattering element may be included), and a flattening layer of high refractive index is then applied thereto.

Patent Document 3 discloses an internal light extraction layer wherein concavo-convex structures are formed on a substrate and does not comprise a flattening layer.

The processes described in the references above are not suitable for producing optical devices such as OLED in a large area scale.

Patent Document 4 discloses an internal light extraction layer having a structure wherein a surface of a substrate is roughened or a film having a micro-structure is attached on a surface of a substrate having low refractive index, and a flattening layer having high refractive index is then applied thereto. Micro-structured film is formed by casting a photopolymer on PET film, which is then filled with polymer. Finally, double layers of 3M Laminating Adhesive 8141 are laminated thereon.

In Patent Document 4, the material used for the formation of nano-structures via a patterning process is primarily a polymer or an organic binder. However, using a patterning process is still problematic in that the polymer or organic binder may be decomposed to cause an outgassing phenomenon and stabilization of the shape of the nano-structures may not be maintained during the subsequent high temperature processes.

Patent Document 5 discloses formation of a structured layer which has feature sizes in the range of several micrometers to scores of μm regularly using the imprinting method, in which a stamp or roller is used. An intermediate layer may be deposited using a liquid solution onto the carrier body in the subsequent planarization step, to reduce the average roughness of the surface of the carrier body.

However, Patent Document 5 does not limit the thickness of the intermediate layer and does not describe the roughness of the intermediate layer for avoiding the problem of short circuit between electrodes. Furthermore, an additional patterning process, such as imprinting, is needed to make the structured layer.

Patent Document 6 discloses formation of a convex structure by using a glass flit paste, wherein the width of the convex structure is limited to 200 μm.

In Patent Document 6, the pitch between the convex structures that can be stably formed is at least about 200 μm, since a pattern having a high inclination angle cannot be formed considering the upper limit of thickness of the flattening layer. Further, a height of the convex structure is limited to the range of 5 μm to 200 μm in order to obtain a predetermined light extraction effect.

If the convex structure has a height of less than 8.75 μm, a low inclination angle (about 5 degrees) is shown to be ineffective in light extraction (i.e., 26.5%). Therefore, to form a convex structure having high inclination angle (about 15 degrees), the height of the convex structures should be more than 26.79 μm. There still remains the problem, however, that forming stable convex structures having a high inclination angle requires the thickness of a flattening layer to be at least double the height of the convex structures to fully cover the convex structures.

Further, when glass frit is used as raw material for the flattening layer, the problem that the concentration of captured air bubbles generated during sintering of the glass frit increases as the thickness increases was found. This means that the flattering layer must have a thickness which fully covers the convex structures. In this regard, there still remains the risk of air bubbles being captured in the internal light extraction layer during sintering, which results in the loss of optical properties of the light emitting device due to increase of light paths.

Therefore, there still remains a need for a simple and economic process for preparing an internal light extraction layer made of enamel (melted glass frit) comprising reliefs. Also needed is an internal light extraction layer made of enamel which can efficiently discharge light to the exterior. Further, there still remains a need for a preferred process for forming a concavo-convex structure without applying an additional patterning process, since applying a patterning process onto a glass substrate is not the most suitable means for producing optical devices, such as OLEDs, at large scale.

PATENT DOCUMENTS (Patent Document 1) PCT Publication No. WO 2012/125321 A2
(Patent Document 2) PCT Publication No. WO 2010/077521 A2
(Patent Document 3) PCT Publication No. WO 2012/086396 A1
(Patent Document 4) PCT Publication No. WO 2002/37568 A1
(Patent Document 5) PCT Publication No. WO 2013/102530 A1
(Patent Document 6) Japanese Laid-Open Patent Publication No. 2013-25900

SUMMARY

It is an object of the invention to provide a laminate for a light emitting device which do not exhibit the above-mentioned problems, in which a random network of reliefs are formed in a simple and economic manner, and without problems such as a short circuit in the electrodes and multiple scattering of light.

It is another object of the invention to provide a laminate for a light emitting device wherein the light being incident at an angle or not less than the critical angle is efficiently scattered by virtue of the network of reliefs formed on the substrate, so that the light is effectively concentrated perpendicularly to the surface of the laminate without the absolute need to add any additional scattering elements.

Accordingly, the present invention provides a highly efficient and low-cost process for preparing a laminate for a light emitting device on a substrate having a large area.

The present invention also provides a laminate for a light emitting device with a transparent electrode formed thereon and an OLED device.

In one embodiment, the present invention provides a laminate for a light emitting device, comprising:

a glass substrate having a refractive index n1 from 1.45 to 1.65;
a random network of reliefs made of enamel, formed on the glass substrate, said network having a refractive index n2 ranging from 1.45 to 1.65; and
a flattening layer made of enamel, formed on said network and said glass substrate, said flattening layer having a refractive index n3 ranging from 1.8 to 2.1,
wherein at least 50% (preferably at least 75% and more preferably at least 85%) of said reliefs show a cross section having:
a height (b) ranging from 1 to 10 μm, preferably the maximal height of said reliefs being lower than 15 μm, and
a width ranging from 2 to 40 μm, preferably at most 10 μm,
and wherein at least 50%, preferably at least 75%, and more preferably at least 85% of pitches (c) of said network are in the range of 2 μm to 15 μm.

The present invention further provides the above-described laminate, wherein the network shows a roughness profile of Ra (arithmetical mean deviation of the roughness profile) ranging from 0.3 μm to 3 μm, preferably 0.3 μm to 1 μm, Ry (maximum height of the roughness profile) ranging from 1 μm to 10 μm, and S (mean spacing of local peaks) ranging from 2 μm to 40 μm, preferably 2 to 20 μm.

The present invention further provides the above-described laminate, wherein a ratio (r) of an average height (b') of the reliefs to an average pitch (c') of the reliefs is from 0.1 to 0.5.

The present invention further provides the above-described laminate, wherein the proportion of area where said network covers said glass substrate is 60 to 90%.

The present invention further provides the above-described laminate, wherein the reliefs comprises hillocks (or at least having curved surface) and/or clusters of hillocks (connected hillocks).

The present invention further provides the above-described laminate, wherein an average total thickness (a') of the network and the flattening layer ranges from 6 to 20 μm.

The present invention further provides the above-described laminate, wherein a thickness of the flattening layer (d) is less than 20 μm.

The present invention further provides the above-described laminate, wherein a roughness Ra measured at the surface of the flattening layer is not more than 1 nm.

The present invention further provides the above-described laminate, wherein said network is formed from a first glass frit, and the first glass flit comprises 10% to 40% by weight of $SiO_2$, 1% to 7% by weight of $Al_2O_3$, 0% to 10% by weight of $P_2O_5$, 20% to 50% by weight of $B_2O_3$, 3% to 35% by weight of ZnO, and 5% to 20% by weight of at least one alkaline metal oxide(s) selected from the group consisting of $Na_2O$, $Li_2O$ and $K_2O$, based on the total weight of the first glass flit after formation of said network.

The present invention further provides the above-described laminate, wherein the flattening layer is formed from a second glass frit, and the second glass frit comprises 55% to 84% by weight of $Bi_2O_3$, 0% to 20% by weight of BaO, 5% to 20% by weight of ZnO, 1% to 7% by weight of $Al_2O_3$, 5% to 15% by weight of $SiO_2$, 5% to 20% by weight of $B_2O_3$, 0 to 0.1% by weight of $CeO_2$, 0.05 to 5% by weight of $Na_2O$ and less than 5% by weight of one or more compounds selected from a group consisting of $TiO_2$, $ZrO_2$, $La_2O_3$, $Nb_2O_3$ and MgO, based on the total weight of the second glass frit after formation of said flattening layer.

The present invention further provides the above-described laminate, wherein the glass substrate is a sodalime glass substrate.

The present invention further provides the above-described laminate, wherein the laminate shows a haze ratio of at least 70% and a total luminous transmittance of at least 65%.

The present invention further provides the above-described laminate, further comprising a transparent electrode on the flattening layer.

In one embodiment, the present invention provides a light emitting device comprising the laminate according to any one of the above described laminates.

In another embodiment, the present invention provides a process for preparing a laminate for a light emitting device, comprising the steps of:
(a) providing a glass substrate having a refractive index n1 from 1.45 to 1.65;
(b-1) forming a first glass frit paste layer by applying a first glass frit paste, comprising an organic solvent and a first glass frit powder on said glass substrate, wherein the first glass frit powder is comprised in an amount of 50% by weight or less based on the total weight of the first glass frit paste, and said first paste layer covers (continuously) a given area of said glass substrate;
(b-2) removing the organic solvent by drying the applied first glass frit paste layer,
(b-3) forming a random network of reliefs by sintering the dried first glass frit layer at a sintering temperature T1 to give partial agglomeration or densification of the first glass frit powder;
(c-1) forming a second glass frit paste layer by applying a second glass frit paste, comprising an organic solvent and a second glass frit powder, on said network;
(c-2) removing the organic solvent by drying the applied second glass frit layer, and
(c-3) forming a flattening layer by sintering the dried second glass frit layer at a sintering temperature T2,
wherein at least 50%, preferably at least 75%, and more preferably at least 85% of said reliefs show a cross-section having:
a height (b) ranging from 1 to 10 μm, preferably the maximum height of said reliefs not being higher than 15 μm, and
a width ranging from 2 to 40 μm, preferably at most 10 μm,
wherein at least 50%, preferably at least 75%, more preferably at least 85% of pitches (c) of said network are in the range of 2 μm to 15 μm.

The present invention further provides the above-described process for preparing a laminate, wherein the first glass frit powder is comprised in an amount from 10% to 50% by weight based on the total weight of the first glass frit paste.

The present invention further provides the above-described process for preparing a laminate, wherein the sintering temperature T1 in step (b-3) is 60 to 110° C. higher than the glass transition temperature of the first glass frit.

The present invention further provides the above-described process for preparing a laminate, wherein the sintering temperature T1 in step (b-3) ranges from 550 to 590° C. and preferably the sintering temperature T2 in step (c-3) is the same or lower than T1.

The present invention further provides the above-described process for preparing a laminate, wherein any additional patterning process such as lithography or imprinting is not involved in steps (b-1) to (b-3).

The present invention further provides the above-described process for preparing a laminate, wherein a ratio (r) of an average height (b') of the reliefs to an average pitch (c') of the reliefs is from 0.1 to 0.5.

The present invention further provides the above-described process for preparing a laminate, wherein an average total thickness (a') of the network and the flattening layer ranges from 6 to 20 μm.

The present invention further provides the above-described process for preparing a laminate, wherein a thickness of the flattening layer is less than 20 μm.

The present invention further provides the above-described process for preparing a laminate, wherein the first glass frit powder comprises 10% to 40% by weight of $SiO_2$, 1% to 7% by weight of $Al_2O_3$, 0% to 10% by weight of $P_2O_5$, 20% to 50% by weight of $B_2O_3$, 3% to 35% by weight of ZnO, and 5% to 20% by weight of at least one alkaline metal oxide(s) selected from the group consisting of $Na_2O$, $Li_2O$ and $K_2O$, based on the total weight of the first glass frit after formation of said network.

The present invention further provides the above-described process for preparing a laminate, wherein the second glass frit powder comprises 55% to 84% by weight of $Bi_2O_3$, 0% to 20% by weight of BaO, 5% to 20% by weight of ZnO, 1% to 7% by weight of $Al_2O_3$, 5% to 15% by weight of $SiO_2$, 5% to 20% by weight of $B_2O_3$, 0 to 0.1% by weight of $CeO_2$, 0.05 to 5% by weight of $Na_2O$ and less than 5% by weight of one or more compounds selected from a group consisting of $TiO_2$, $ZrO_2$, $La_2O_3$, $Nb_2O_3$ and MgO, based on the total weight of the second glass frit after formation of said flattening layer.

The present invention further provides the above-described process for preparing a laminate, wherein the glass substrate is a sodalime glass substrate.

Theoretically, the closer the pitch (c) between the reliefs becomes twice the height (b) of the reliefs, more superior performance of light extraction can be expected. The angle between the reliefs and substrate is preferably used to show optimal light extraction efficiency. If the pitch between the reliefs becomes twice the height of the reliefs, optimal light extraction efficiency can be achieved. If the pitch between the reliefs is wider than twice the height of the reliefs, agglomeration between the reliefs can occur. If the pitch between the reliefs is narrower than twice the height of the reliefs, light extraction efficiency may be reduced due to back scattering. Ensuring process conditions that achieve the best performance is one of the objectives of the present invention.

The present invention proposes a process for preparing a random network of reliefs having low refractive index and fine line width without the need for an additional patterning process. This is achieved by adopting a glass paste process that provides high production yield at low cost as a core technique for preparing an internal light extraction layer.

Through the process of the present invention, in the area of the first glass frit paste layer, the substrate is completely covered (by this first glass frit paste layer). Some portions of the substrate may not be coated with the first frit layer. If the first glass frit paste layer is continuous, a random network of suitable reliefs is formed with only sintering of the paste layer.

The inventors of the present invention made a first glass frit paste layer insufficient to form a continuous melted glass frit (enamel) layer on the substrate after heating, by adjusting the content of glass flit particles in the glass frit paste and the coating thickness. If the amount of glass flit particles or the thickness of the glass frit paste layer is insufficient, the glass frit particles tend to form inter-particulate agglomerates at the surface of the glass substrate during the heating process. After drying and removing organic materials in the coated layer, such agglomerates or reliefs are randomly distributed at the surface of the glass substrate to form, after sintering, reliefs having a curved surface (hemispherical) and random distribution.

Density of the reliefs is mainly controlled by the concentration, and to some extent the coating thickness, of the glass flit paste. Average size of the reliefs can be controlled by the concentration of glass flit particles in the first glass flit paste.

Thus, the agglomerates or reliefs having a curved surface (hemispherical) can be bonded onto the substrate by setting the sintering temperature of the first glass flit paste (T1) to be lower than a temperature that can form a completely uniform single layer of the first glass frit paste.

According to said process, a ratio (r=b'/c') of an average height (b) of the reliefs to an average pitch (c') of the reliefs, which influences the performance of light extraction, can also be controlled. The greater the ratio (r), the higher the light extraction effect would be. Ratio (r) is preferably controlled to be 0.5 or less, preferably about 0.1 to about 0.5, in order to prevent merging of the agglomerates or reliefs.

According to the present invention, a proportion of the substrate area on which the network of reliefs are formed, which means the area of the network of reliefs based on total area of the substrate, measured by optical image processing, ranges from 60 to 90%, and the process for coating the first glass frit paste on a substrate is characterized in that the value obtained by multiplying the weight proportion of the glass flit with the thickness of the liquid phase of the first glass frit paste layer to be coated satisfies the value of 3 to 5 μm.

The invention is also characterized in that an average value of the total thickness (a') of said network and said flattening layer ranges from about 6 to about 20 μm, preferably no more than 15 μm.

The optical critical angle where the light incident from the flattening layer is totally reflected on the interface with the network is $\sin^{-1}(n_2/n_1)$, wherein $n_1$ represents the refractive index of the flattening layer, and $n_2$ represents the refractive index of the network of reliefs. If it is assumed that light emitted from an optical device, such as an OLED, has a lambertian distribution, there is no occurrence of a total internal reflection in which the angle between the incident light and the normal to the interface between the two layers is lower than $\sin^{-1}(n_2/n_1)$ (so-called "optical critical angle"). This occurs most likely when the angle between the normal to the interface between the two layers and the normal to the light emission surface (so-called "interfacial inclination angle") is higher than $90-\sin^{-1}(n_2/n_1)$. If it is assumed that, $n_1=1.9$ and $n_2=1.5$, the minimum interfacial angle of inclination to minimize total internal reflection is 38 degrees.

With regard to the average total thickness (a'), if a uniform flattening layer (d) over the entire area of the substrate is obtained, the average total thickness (a') is preferably more than twice of the height (b) of the network of reliefs. However, the average total thickness (a') is preferably not more than 20 μm, since light loss increases with increased light paths as the thickness of the flattening layer increases.

When a glass frit having high refractive index is used to form the flattening layer, the number of captured air bubbles formed between the glass frit particles generated during sintering increases if the thickness of the flattening layer increases. The surface roughness of the flattening layer increases if the captured air bubbles cannot escape and gather on the outmost surface of the flattening layer during the sintering process. Accordingly, the thickness of the flattening layer (d) is preferably not more than 20 μm, more preferably lower than 15 μm or 10 μm, and the height (b) of the relief is preferably not more than 10 μm, more preferably lower than 5 μm or 2 μm.

For the laminate for a light emitting device according to the invention, a glass substrate widely used in the art, such as a sodalime substrate can be used, and an internal light extraction layer can be efficiently prepared through a simple and inexpensive process, notably without an additional process for treating the substrate or even addition of a scattering element.

The random network of reliefs comprised in the laminate for a light emitting device according to the present invention can be effectively formed through a simple sintering stage, notably without an additional patterning process. Since a glass fit, which has lower light absorbance but high transmittance and a similar refractive index to that of a glass substrate, is used as a material to form the network of reliefs, light loss can be efficiently avoided.

Since the laminate for a light emitting device according to the present invention comprises a flattening layer, an internal light extraction layer can be formed with a smooth surface without unevenness, the problem of a short circuit in the electrodes would not occur.

Further, in the laminate for a light emitting device according to the present invention, shape of the reliefs or an angle between the reliefs and the substrate surface can be freely controlled, so that the light being emitted at an angle of not less than the critical angle is not lost and can be outwardly emitted in an efficient manner. Therefore, a laminate for a light emitting device with a large area can be more simply and easily manufactured as compared to an internal light extraction layer on which reliefs were formed by patterning or grinding the surface of the substrate by conventional procedures. Further, light transmittance at a perpendicular direction can be maintained at an equivalent or more superior level.

Since the reliefs are formed from a glass frit, a problem like degassing does not occur during the heating process for preparing an OLED. Thus, the relief structures of the internal light extraction layer can be stably retained even during a high temperature process, as well as having excellent moisture resistance.

BRIEF DESCRIPTION OF THE DRAWINGS

The above and other features and benefits of the present invention will become more apparent by describing in detail exemplary embodiments thereof with reference to the attached drawings in which.

DETAILED DESCRIPTION

Terms

Figure 1:
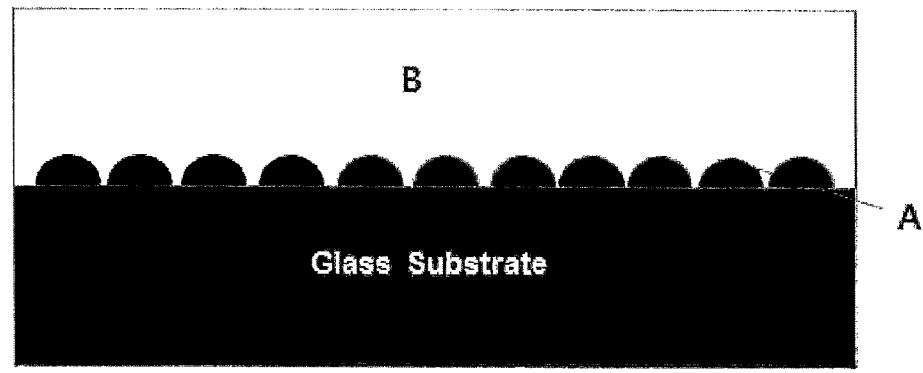
FIG. 1 is a schematic cross-sectional view of a laminate for a light emitting device comprising an internal light extraction layer according to the present invention.

Hereinafter, the terms used in the specification will be described.

When the term "about" is used together with a numerical value, "about" is construed to imply all values including an error range within a significant figure of a corresponding numerical value.

The term "laminate" denotes a structure in which two or more layers are stacked, and may be separately used in a light emitting device, or used in a state where another layer (for example, transparent electrode, or the like) is additionally stacked on the laminate.

The term "glass flit" is a raw material for forming an internal light extraction layer, and may denote a glass powder. The terms "glass frit paste" denote a paste in which the glass frit is mixed with a solvent, a binder, etc. In the specification, the term "melted glass flit (or sintered glass frit)" is sometimes referred as "enamel." The term "glass frit paste layer" denotes a layer in which a paste comprising the glass frit powder is applied on a substrate.

The term "low refractive index" means a refractive index being similar to that of a glass substrate, within a range from about 1.45 to about 1.65.

The term "high refractive index" means a refractive index being higher than that of a glass substrate, within a range from about 1.8 to about 2.1.

The term "internal light extraction layer" denotes a layer which, when it is used for an optical device such as an OLED, is located between the substrate and the transparent electrode, to effectively extract the light being lost due to a refractive index difference between the substrate and the transparent electrode layer and/or the organic layer. In the specification, an internal light extraction layer should be understood as including both the random network of reliefs and the flattening layer, and the internal light extraction layer may comprise other scattering elements or substances in addition to the glass frit.

The term "reliefs" means structures formed on the glass substrate, which are connected to each other or exist as an island shape. Reliefs may include those of hemispherical, pyramid, trigonal pyramid, tunnel shape, or the like. However, a structure having a rounded surface is preferred. Of course, reliefs are protuberances in a direction opposite to the glass substrate. Advantageously, a random network of reliefs is comprised in the laminate of the present invention. The reliefs may or may not be mutually connected, or when they are connected to each other, the lower parts of said reliefs may be connected to one another. Further, the lower part of the reliefs is tightly adhered to the glass substrate. Sometimes, the relief is referred as hillock in the specification. Sometimes, the term "network" means the (random) network of reliefs in the specification.

The term "flattening layer" means a layer covering the network of reliefs. The uppermost part preferably satisfies $\Delta Ra \leq 1$ nm.

The term "laminate for a light emitting device" denotes a structure in which the internal light extraction layer is stacked on the substrate.

The term "pitch" of the reliefs means a distance from a center of the lowest part of a relief to a center of lowest part of another adjacent relief.

<Substrate>

As the substrate used the present invention, any substrate suitable for use in the art of light emitting devices can be used. In order to support the light emitting device, a glass substrate having a thickness of 150 μm to several millimeter is preferably used. The thickness of glass substrate is preferably from 0.3 to 2.0 mm, more preferably from 0.5 to 1 mm. The glass substrate in the present invention can be a sodalime, a borosilicate glass, or even of a glass-ceramic type substrate, regardless of haze ratio of the glass substrate.

Preferably the visible light transmittance of the glass substrate is at least 70%.

Any substrates made of other substances, which can endure a high-temperature sintering process, preferably transparent, can be used for the present invention.

<Glass Frit>

The glass flit of the present invention is classified as the first glass frit and the second glass frit. The first glass frit is a raw material of low refractive index suitable for forming a random network of reliefs, and it is a powder. The second glass frit is a raw material of high refractive index suitable for forming a flattening layer, and it is a powder.

When the first glass frit is sintered to form a network of reliefs, and the second glass fit is sintered to form a flattening layer, all the compositions of the glass frit is preferably identical to all the compositions of the formed reliefs and the flattening layer. Accordingly, the features of the composition of the glass frit as described below correspond preferably to those of the enamel (melted or sintered glass frit).

The First (Low Refractive Index) Glass Flit

The first glass flit has a refractive index n2 of about 1.45 to about 1.65, preferably of 1.5 to 1.6, after sintering. The refractive index range preferably is similar to the n1 of the glass substrate, for example, satisfying $n2-n1<0.1$. If the refractive index n2 of the first glass flit is similar to that of the glass substrate, loss of light at the interface between the reliefs and the glass substrate can be prevented. Glass transition temperature of the first glass flit according to the present invention ranges from about 420 to about 500° C.

The first glass frit according to the present invention comprises about 10% to about 40% by weight of $SiO_2$, about 1% to about 7% by weight of $Al_2O_3$, 0% to about 10% by weight of $P_2O_5$, about 20% to about 50% by weight of $B_2O_3$, about 3% to about 35% by weight of ZnO, and about 5% to about 20% by weight, preferably 10 to 15% by weight of at least one oxide of an alkali metal selected from the group consisting of $Na_2O$, $Li_2O$ and $K_2O$, based on the total weight of the first glass frit.

Silicon dioxide ($SiO_2$) is a component that stabilizes the phase of the glass frit. The content is about 10 to about 40% by weight, preferably 20 to 35% by weight. A content of less than the lower limit is undesirable because chemical resistance of the glass frit deteriorates. A content that exceeds the upper limit is undesirable because of increased softening temperature of the glass frit.

Aluminum oxide ($Al_2O_3$) is a component that stabilizes the phase of the glass frit. The content is about 1 to about 7% by weight, preferably 1.5 to 5% by weight, and more preferably 2 to 4% by weight. A content less than the lower limit is undesirable because the phase of the glass flit becomes unstable and chemical resistance of the glass frit deteriorates. A content that exceeds the upper limit is undesirable because of increased softening temperature of the glass frit.

Phosphorus pentoxide ($P_2O_5$) serves to lower the refractive index of the glass frit and, at the same time, promote flatness of the flattening layer. The content is not more than about 10% by weight. When the content exceeds the upper limit, decrease of moisture resistance of the glass frit layer deteriorates.

Diboron trioxide ($B_2O_3$) is a component that lowers the thermal expansion coefficient, stabilizes the phase of the glass frit, and lowers the sintering temperature. The content is about 20 to about 50% by weight, preferably 30 to 45% by weight. A content less than the lower limit is undesirable because the phase of the glass frit becomes unstable. A content that exceeds the upper limit is undesirable because of increased softening temperature of the glass frit.

Zinc oxide (ZnO) is a component that lowers the sintering temperature of the glass frit. The content is about 3 to about 35% by weight. A content that exceeds the upper limit of 35% is undesirable since it may cause deterioration of chemical resistance or increase of the refractive index.

Alkaline metal oxide selected from a group consisting of $Na_2O$, $Li_2O$ and $K_2O$ is a component that serves to lower the softening temperature of the glass frit and lower the refractive index. The content may be about 5 to about 20% by weight, preferably 10 to 20% by weight. A content less than the lower limit is undesirable because softening temperature of the frit may be increased. A content that exceeds the upper limit is undesirable because of deterioration of the chemical resistance.

The first glass frit, in contrast to the second glass frit, preferably does not comprise $Bi_2O_3$.

The Second (High Refractive Index) Glass Frit

The second glass frit for forming a flattening layer has a refractive index of about 1.8 to about 2.1, preferably 1.90 to 2.05. The thermal expansion coefficient of the second glass frit is about $70 \times 10^{-7}$ to about $90 \times 10^{-7}/°C$. The range of refractive index is a value corresponding to a refractive index of each of a light transmissive electrode layer and organic layer of a general optical device, especially an OLED device, and is for minimizing the influence of the refractive index difference on light extraction efficiency. The thermal expansion coefficient is set up within a range for preventing the glass substrate (which is a light transmissive substrate that is the basis of formation of the flattening layer) from being deformed or deteriorated during sintering of the frit. The glass transition temperature of the second glass flit according to the present invention is about 420 to 490'C.

The second glass frit of the present invention comprises about 55 to about 84% by weight of $Bi_2O_3$, 0 to about 20% by weight of BaO, about 5 to about 20% by weight of ZnO, about 1 to about 7% by weight of $Al_2O_3$, about 5 to about 15% by weight of $SiO_2$, about 5 to about 20% by weight $B_2O_3$, 0 to about 0.1% by weight $CeO_2$, about 0.05 to about 5% by weight of $Na_2O$ and less than 5% by weight of one or more compounds selected from the group consisting of $TiO_2$, $ZrO_2$, $La_2O_3$, $Nb_2O_3$ and MgO, based on the total weight of the second glass frit.

Bismuth trioxide ($Bi_2O_3$) is a component for lowering a sintering temperature of the glass flit and increasing a refractive index, and BaO is a component which can be contained together with $Bi_2O_3$ that assists in increasing the refractive index. The content of $Bi_2O_3$ is about 55 to about 84% by weight, preferably 60 to 70% by weight. The content of BaO is 0 to about 20% by weight, preferably 0 to 10% by weight, more preferably 0 to 5% by weight. In some embodiments, the content of BaO may be zero (0). When the content of $Bi_2O_3$ is less than the lower limit, it is difficult to satisfy a refractive index range of 1.8 to 2.1 because a refractive index may be lowered, and it is undesirable because a sintering temperature increases. When a content of $Bi_2O_3$ exceeds the upper limit, the glass frit strongly absorbs blue-range light, and thermal stability decreases during sintering, causing deterioration of the surface of the internal light extraction layer. Since BaO has a weak effect in lowering the sintering temperature of the glass frit, BaO may replace a part of $Bi_2O_3$. However, when a composition of BaO is more than the upper limit, the sintering temperature exceeds an allowable range, thereby causing problems.

Zinc oxide (ZnO) is a component for lowering a sintering temperature of the glass flit. The content is about 5 to about 20% by weight, preferably 5 to 15% by weight, and more preferably 5 to 13% by weight. A content that exceeds the upper limit is undesirable because a phase of the glass frit becomes unstable, acid resistance is weakened, and the glass frit strongly absorbs green-range light.

Aluminum oxide ($Al_2O_3$) is a component for stabilizing a phase of the glass frit. The content is about 1 to about 7% by weight, preferably 1.5 to 5% by weight, and more preferably 2 to 4% by weight. A content of less than the lower limit is undesirable because a phase of the glass flit becomes unstable and a chemical resistance is weakened. A content that exceeds the upper limit is undesirable because a refractive index of the glass frit is lowered and a sintering temperature increases.

Silicon oxide ($SiO_2$) is a component for stabilizing a phase of the glass frit. The content is about 5 to about 15% by weight, preferably 6 to 14% by weight, and more preferably 7 to 12% by weight. A content of less than the lower limit is undesirable because a phase of the glass fit becomes unstable. A content that exceeds the upper limit is undesirable because the refractive index of the glass fit is lowered and a sintering temperature increases.

Diboron trioxide ($B_2O_3$) is a component for lowering thermal expansion coefficient, stabilizing a phase of the glass fit, and lowering a sintering temperature. The content is about 5 to about 20% by weight, preferably 6 to 15% by weight, and more preferably 7 to 12% by weight. A content of less than the lower limit is undesirable because a phase of the glass frit becomes unstable. A content that exceeds the upper limit is undesirable because the water resistance of the internal light extraction layer is weakened.

A composition of the glass frit according to an embodiment of the present invention does not contain any transition metals, such as Fe, V, Cr, Mn, Ni, Co, Cu, Pd, Ag, Au, Pt, Cd, etc. Such transition metals suppress the high-temperature reduction of $Bi_2O_3$ or the like, thereby preventing the yellowing of a film during the sintering process, and thus, a transition element is generally added into the glass frit with $Bi_2O_3$. However, every transition metal exhibits strong absorbing characteristics within a specific light wavelength range, and particularly, when a light path increases due to scattering in the internal light extraction layer, light absorption by a transition element may cause serious optical loss. Therefore, it is very important to avoid adding a transition element into the composition of the glass frit.

However, since the light absorbing property of $CeO_2$ is limited to the dark blue range (though Ce belongs to lanthanide elements), an optical influence of $CeO_2$ is weak on an OLED lighting device having a blue light source of a phosphor. Further, $CeO_2$ aids complete burning in a burn-out process of an organic material in preparing the light extraction layer. Therefore, $CeO_2$ may be added in an amount not more than 0.1% by weight. On the other hand, in a specific embodiment of the present invention, $CeO_2$ is not added.

$Na_2O$ is a component added for lowering the densification temperature of the glass frit. The $Na_2O$ content in the glass frit may be about 0.05 to about 3% by weight, preferably 0.1 to 2% by weight, and more preferably 0.5 to 1.5% by weight. A $Na_2O$ content of less than the lowest limit of the above ranges is not preferable because the sintering temperature of the glass frit increases. A $Na_2O$ content greater than the upper most limit of the above ranges is not preferable because a chemical resistance is weakened.

Oxides, such as $TiO_2$, $ZrO_2$, $La_2O_3$, $Nb_2O_3$ and MgO, may be added to the glass frit. The oxides can be comprised as a single oxide or a mixture of two or more oxides, when it is required to maintain a refractive index of the glass frit of not less than 1.8 and to maintain fine control of the sintering temperature of the glass frit paste. The content is preferably not more than 5% by weight. When the content exceeds the upper limit, it is difficult to form a light-transmissive enamel, and the softening temperature increases to an undesirable level.

Furthermore, it is preferable that the glass frit does not contain any one of P, Pb, Ta, Y, Sn, Gd, V and Mo.

<Preparation of Laminate for a Light Emitting Device>

A paste including the first glass frit according to the present invention is applied on a glass substrate to form a first glass frit layer, and organic solvent is removed by drying. A composition of the glass frit included in the first glass frit paste is as described above, and the first glass frit paste comprises at most 50% by weight, preferably 10 to 50% by weight of glass frit and a balanced amount of binder and solvent, etc. The first glass frit paste according to the present invention has lower content of glass frit and higher content of solvent and binder as compared to a glass fit paste conventionally used for forming an internal light extraction layer. The first glass frit paste is also preferably applied on a glass substrate that is sufficiently thin to form reliefs by agglomeration of the dried first glass frit layer during sintering.

In order to form a random network of reliefs according to the present invention by using the first glass frit paste, a proportion of area of the substrate on which reliefs are formed may range from 60 to 90%. An optical image may be measured by high resolution optical microscope.

The process for coating the first glass frit paste on a substrate is characterized in that the value obtained by multiplying the weight proportion of the glass frit with thickness of the liquid phase of the first glass flit paste layer to be coated satisfies a value of 3 to 5 µm.

The paste may be applied by a coating method generally used in the art, such as screen printing, slit die coating, bar coating, roll coating, or the like, but the method is not limited thereto.

The dried first glass frit layer is then sintered at a temperature between about 550 to about 590° C., preferably at a temperature between 560 to 580° C., which is about 60 to 110° C. higher than the glass transition temperature of the first glass flit, to form the network of reliefs.

A paste including the second glass frit according to the present invention is applied on the prepared network of reliefs to form a second glass frit layer, and organic solvent is removed by drying. A composition of the glass frit included in the second glass frit paste is as described above, and the second glass frit paste comprises preferably 70 to 80% by weight of glass frit and a balanced amount of binder and solvent, etc. The method of coating the paste is the same as that described for the first glass frit paste. The second glass frit paste layer is sintered to form a flattening layer at a sintering temperature that is preferably the same or lower than that of the first glass frit paste layer. This is to prevent deformation of reliefs.

The flattening layer according to the present invention serves to effectively emit light in a perpendicular direction from the surface of the internal light extraction layer (due to its high refractive index) and to flatten the surface. The uppermost surface of the flattening layer formed is preferably flattened to have a surface roughness of 1 nm or less, as measured by an atomic force microscope (AFM). A surface roughness of 1 nm or more is disadvantageous in that, due to the unevenness of the surface, if an electrode layer is applied on an internal light extraction layer, for example, unevenness occurs even on the electrode layer to a cause short circuit in the electrodes.

FIG. 1 is a schematic cross-sectional view of a light emitting device with an internal light extraction layer according to the present invention, which comprises a random network of reliefs formed on a glass substrate from the first glass frit, and a flattening layer formed from the second glass frit on the network of reliefs.

Figure 2:
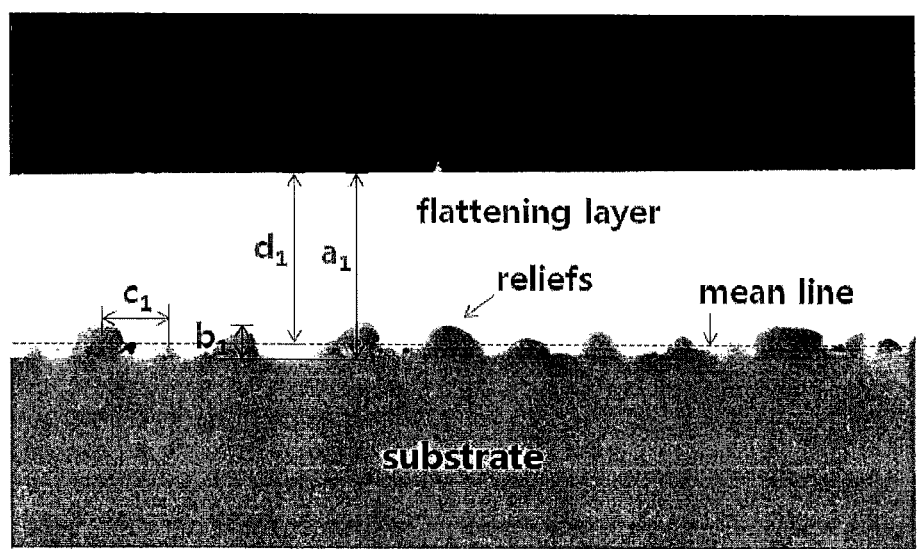
FIG. 2 is a scanning electronic microscope (SEM) photograph of a cross-section of a laminate for a light emitting device comprising an internal light extraction layer prepared according to the description of Example 1 (a1=a total thickness of a flattening layer and a network of reliefs; b1=a height of a relief, c1=a pitch (distance between reliefs), and d1=a thickness of a flattening layer)).

FIG. 2 is an SEM photograph of a cross-section of an internal light extraction layer actually formed according to the present invention. From FIG. 2, we can plot the mean line of the roughness profile of the random network of reliefs, and measure the thickness of the flattening layer as the distance from this mean line to the top surface of the flattening layer.

As shown in FIG. 2, a relief has a height ($b_1$) of 3.1 µm, a width of 5.3 µm, and a pitch ($c_1$) (a distance between reliefs) of 10.6 µm, and a thickness of the flattening layer ($d1$) is 11.3 µm. The ratio ($r_1=b_1/c_1$) between a height ($b_1$) to a pitch ($c_1$) of a relief is about 0.3.

If the mean thickness of said reliefs exceeds 5 µm, the thickness of the flattening layer will be increased accordingly, so that the total thickness of the network of reliefs and the flattening layer increases. This results in the risk of deterioration of light transmittance. Therefore, it is preferable that a height (b) ranges from 1 to 10 µm, with the maximum height of said network being lower than 15 µm, and a width ranges from 2 to 40 µm, preferably at most 10 µm. Further, it is preferable that at least 50% (preferably at least 75%, and more preferably at least 85%) of pitches (c) of said network is in the range of 2 µm to 15 µm.

A ratio (r=b'/c') of an average height (b') to an average pitch (c') of the reliefs is from 0.1 to 0.5, preferably 0.2 to 0.4.

An average total thickness (a') of the network and the flattening layer is from 6 µm to 20 µm.

When the height (b) of the reliefs, the ratio (r) of the height of the reliefs (b) to the pitch (c) of the reliefs, and the average total thickness (a') of the network and the flattening layer are within the range as described above, light scattering of a light incident from the lower part of the glass substrate is maximized by the uniform formation of the reliefs, thereby providing a homogeneous light extraction effect at the same time.

When the network of reliefs with low refractive index having the shape of a pyramid, a quadrangle, a circle or an ellipse are formed, a change results in the critical angle of an incident light which satisfies the total reflection condition between the flattening layer of high refractive index and the network of reliefs of low refractive index. This eventually inhibits the light extinction phenomenon due to repeated total reflection (a wave-guiding phenomenon) between the cathode reflection layer of an OLED and a layer of low refractive index, which contributes to the increase of light extraction efficiency. Thus, the higher the ratio (r), the larger the scope of change in the critical angle, the light scattering intensity and the probability of light extraction. However, the ratio (r) is preferably controlled to 0.5 or less in order to avoid merging between the agglomerates or reliefs.

Figure 3:
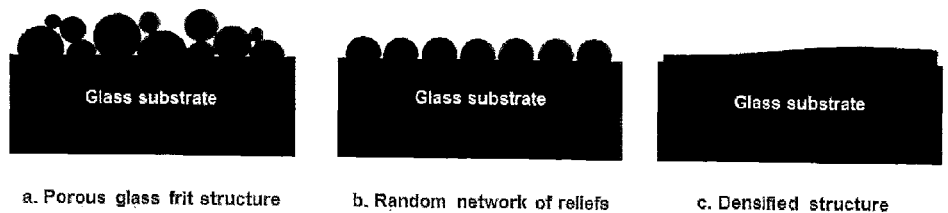
FIGS. 3a-3c is a schematic view illustrating the structural change of a first glass frit layer depending on sintering temperature of the first glass frit.

FIG. 3 schematically shows structural change of the first glass frit layer depending on the sintering temperature of the first glass frit. FIG. 3a shows the formation of porous glass frit structure wherein glass frit particles have not merged, when the first glass frit layer was sintered at a temperature lower than a temperature at which the network of reliefs can be formed. FIG. 3b shows the network of reliefs formed according to the present invention by sintering the first glass frit layer at an appropriate temperature at which the network of reliefs can be formed, to give partial agglomeration relief during sintering of the glass fit particles. FIG. 3c shows a densified structure in a continuous film shape with the glass frit particles completely sintered when the first glass frit layer was sintered at a temperature higher than a temperature at which reliefs can be formed.

Thus, in order to form the network of reliefs according to the present invention, a composition of the first glass frit, a limited thickness of the first glass frit layer and an appropriate sintering temperature are critical. Based on the experimental results, it is preferable that a sintering temperature is about 60 to 110° C. higher than the glass transition temperature of the first glass frit. When said sintering temperature is too high, the first glass frit layer readily forms a densified structure. On the other hand, when said temperature is too low, the first glass frit layer forms a porous glass frit structure. If the first glass frit layer forms a porous glass frit structure as shown in FIG. 3a instead of the network of reliefs as shown in FIG. 3b, the optical transmittance deteriorates due to the porous glass flit structure.

A small amount of voids may be formed inside the internal light extraction layer during the sintering process irrespective of the network of reliefs of the present invention. While this is inevitable during sintering of the glass frit layer, it is desirable that the voids are formed so as not to affect the total transmittance, absorbance, and haze ratio of a laminate for an light emitting device.

The laminate for the light emitting device of the present invention can effectively extract light (which is lost at the interface) to the outside, maintain optical characteristics, such as the total transmittance and optical transmittance in a perpendicular direction, at a level similar to or better than an existing laminate for a light emitting device wherein a concavo-convex structures are formed on a substrate by using a patterning process after applying an additional layer. Furthermore, the laminate according to the invention is advantageous in that the preparation process is simple and convenient, the shape of the network of reliefs can be freely controlled, and the laminate can be prepared with a large area.

The laminate for a light emitting device of the present invention may be used in a state where a transparent electrode layer (transparency given by the nature of material or by the arrangement in grid of metal absorbent and/or reflective like silver) is additionally stacked on the internal light extraction layer, when being applied to an optical device such as an OLED. As the material for the transparent electrode layer, inorganic conductive materials such as transparent conductive oxide (TCO), for example, indium tin oxide (ITO), doped $SnO_2$, indium zinc oxide (IZO), doped zinc oxide (ZnO) such as aluminium doped zinc oxide (AZO) or gallium doped zinc oxide (GZO) or graphene, or organic conductive materials, for example, polymeric material such as polyethylene dioxythiophene doped with polystyrene sulfonic acid (PSS) (PEDOT:PSS) or phthalocyanines such as copper phthalocyanine (CuPc) can be used. The transparent electrode can comprise a metal grid, for example, silver grid, or the like.

When the transparent electrode comprises the metal grid, the metal grid can have a thickness of at least 100 nm and preferably at most 1500 nm. The grid can be formed from strands (also known as tracks) having a width A smaller than or equal to 50 μm and separated by an inter-strand distance B smaller than or equal to 5000 μm. These strands can be separated by a plurality of electrically insulated layers having a refractive index higher than 1.65, all covered by an electroconductive coating (inorganic materials such as transparent conductive oxide or organic materials, as described above).

The strands are interconnected in the active zone of the OLED or (only) connected via their ends to electrical contacts. The grid may take the form of linear strands running parallel to one another and connected to electrical contacts through vias at their ends and/or may even take the form of closed patterns or meshes (strands interconnected to one another defining closed patterns), for example geometric (rectangular, square, polygonal, honeycomb, etc.) patterns of nonuniform shape and/or nonuniform size. The grid may contain a linear zone (strips of strands or tracks) and a zone containing closed patterns (meshed strands or tracks). The thickness may be smaller than 1500 nm, preferably less than 1000 nm, and especially from 100 nm to 1000 nm; or less than 800 nm, especially from 200 nm to 800 nm; or less than 650 nm.

The width A can be chosen to be smaller than or equal to 50 μm in order to limit the visibility of the strands to the naked eye, and it can be chosen to be at least 100 nm in order to more easily obtain the objective of a low Rsquare. The width A can be smaller than 30 μm, and preferably from 1 to 20 μm and even more preferably from 1.5 to 20 Lm or 1.5 to 15 μm. The inter-strand distance B may be at least 50 μm and even at least 200 μm and smaller than 5000 μm, preferably smaller than 2000 μm and even smaller than 1000 μm.

Another feature of the metal grid is a coverage T which is smaller than 25% and preferably smaller than 10%, and even smaller than 6% or than 2%. In particular, it may be desirable that the inter-strand distance B is between 2000 and 5000 μm when the thickness is between 800 and 1500 nm, and the width A is between 10 and 50 μm. This corresponds to a coverage of between 0.4 and 6.0%. In particular, it may be desirable that the inter-strand distance B is between 200 and 1000 μm when the thickness is smaller than 500 nm, and the width A is between 3 and 20 μm or even from 3 to 10 μm. This corresponds to a coverage of between 0.5 and 22% or even from 0.5 to 11%.

The metallic grid electrode disclosed in WO2014/135817 (A1) can be used. The metal grid can be formed by silvering.

A conventional deposition method of the transparent electrode layer, such as sputtering or deposition, and a conventional patterning method of the transparent electrode layer, such as photolithography, etching or printing, may be used for preparing a transparent electrode pattern.

In a laminate for a light emitting device according to the present invention, a barrier layer, which comprises silicon nitride, titanium oxide, aluminum oxide or the like, and preferably has a refractive index of 1.8 or more and a thickness of 200 nm or less, may be present between the internal light extraction layer and the electrode. Meanwhile, it is possible to increase light extraction efficiency and to protect the internal extraction layer from chemical etching through an additional process of depositing a $SiO_2$, SiON, $Si_3N_4$, $TiO_2$ or $Al_2O_3$, or $TiO_2$—$Al_2O_3$ alloy barrier layer having a thickness of 5 to 50 nm on the internal light extraction layer. The barrier layer may comprise $SiO_2$ and/or $Si_3N_4$ or an intermediate component called SiON. The barrier layer may comprise $TiO_2$ and/or $Al_2O_3$ or an intermediate component such as $TiO_2$—$Al_2O_3$ alloy. Furthermore the barrier layer can be formed as a monolayer or as a multilayer (for example, alternating $SiO_2$ and $Si_3N_4$ layers, or $TiO_2$ and $Al_2O_3$ layers).

EXAMPLES

Detailed examples are as described below. However, the examples are merely for the purpose of better understanding and should not be construed as limiting the scope of the present invention.

Example 1

Preparation of a Laminate for a Light Emitting Device

A sodalime glass substrate, which has a thickness of 0.7 mm; a first glass frit paste comprising 20% by weight (based on the total weight of the paste) of glass frit which comprises 28.4% by weight of $SiO_2$, 3.6% by weight of $Al_2O_3$, 39.5% by weight of $B_2O_3$, 11.6% by weight of ZnO, 3% by weight of $P_2O_5$ and 13.9% by weight of $Na_2O$ (based on the total weight of the first glass frit paste), and 80% by weight (based on the total weight of the paste) of ethyl cellulose as a binder and butyl carbitol acetate as a solvent; and a second glass frit paste comprising 75% by weight (based on the total weight of the paste) of glass frit which comprises 70% by weight of $Bi_2O_3$, 10% by weight of ZnO, 3% by weight of $Al_2O_3$, 7% by weight of $SiO_2$, 9% by weight of $B_2O_3$ and 1% by weight of $Na_2O$ (based on the total weight of the second glass flit paste), and 25% by weight (based on the total weight of the paste) of ethyl cellulose as a binder and butyl carbitol acetate and pine oil as a solvent were prepared.

The glass substrate was cleaned, and then the first glass frit paste was coated on the glass substrate by means of a screen printing method. The solvent was evaporated by drying the coated paste in an oven at 150° C. for about 20 minutes. Subsequently, ethyl cellulose contained in the dried paste was removed by keeping the dried paste in an oven at a temperature of 450° C. for about 20 minutes.

The dried first glass frit layer was sintered at a temperature of 570° C. for about 10 minutes to form a random network of reliefs. The glass frit layer may be heated to remove ethyl cellulose and sintered by a successive process using a roll hearth furnace (RHF) or by using separate ovens. The network of reliefs prepared had a refractive index of 1.54 and a glass transition temperature of about 480° C.

Figure 4:
FIG. 4 is a microphotograph of the random network of reliefs prepared according to the description of Example 1.

FIG. 4 is a microphotograph of the random network of reliefs prepared as described above, which confirms the formation of the network of reliefs on the glass substrate by sintering of the first glass frit layer. The coverage of a random network of reliefs on the glass substrate, which can be calculated by optical image processing, is about 78% according to FIG. 4.

Figure 5:
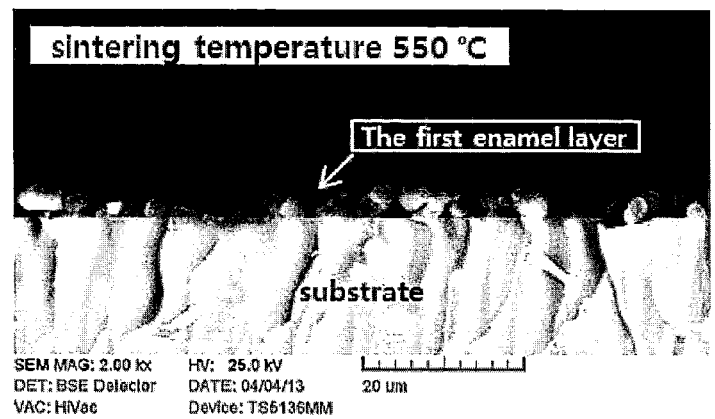
FIGS. 5a-5c shows SEM photographs of internal light extraction layers prepared according to the description of Example 1, with different sintering temperatures.
Figure 5:
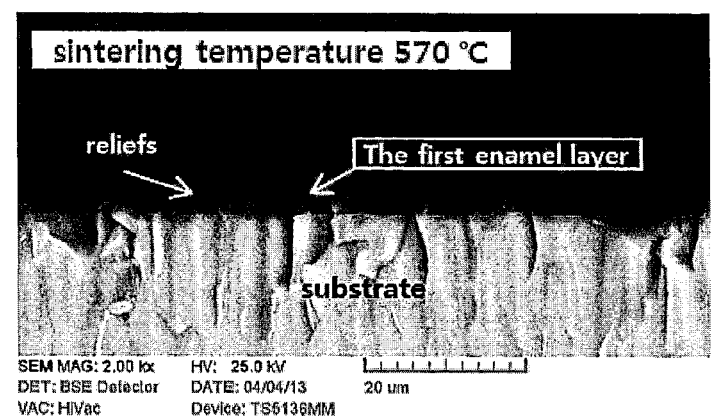
Figure 5:
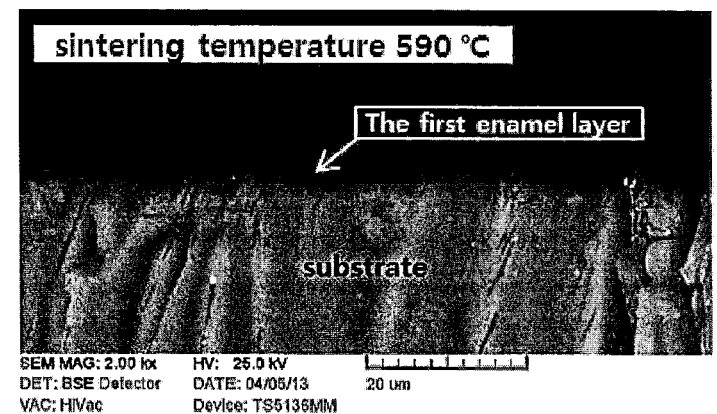

FIG. 5 shows SEM images of internal light extraction layers prepared according to Example 1, except with different sintering temperatures. FIG. 5a is an SEM image of an internal light extraction layer comprising porous first glass frit structures, in the case where the sintering temperature of the first glass frit layer is lower than 550° C. FIG. 5b is an SEM image of an internal light extraction layer comprising a random network of reliefs made of the first glass frit, in the case where a sintering temperature of the first glass frit layer is 570° C. FIG. 5c is an SEM image of an internal light extraction layer comprising a densified layer of the first glass frit, in the case where the sintering temperature of the first glass frit layer is 590° C.

Figure 6:
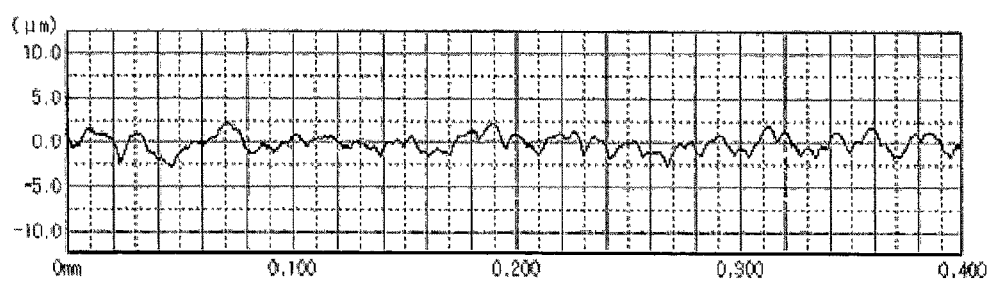
FIG. 6 is a roughness profile for a laminate for a light emitting device prepared according to Example 1.

FIG. 6 shows roughness profiles of the network of reliefs, which were measured using a cut-off filter having a profile filter ($\lambda_c$) of 0.08 mm and a profile filter ($\lambda_s$) of 0.08 μm. Ra (arithmetical mean deviation of the roughness profile) is 0.70 μm, Ry (maximum height of the roughness profile) is 3.69 μm and S (mean spacing of local peaks) is 4.87 μm. The roughness profile was measured using the JIS B 0601:1994 standard. SURFCOM 1400D manufactured by Japan Tokyo Seimitsu Co., Ltd. was used for the measurement.

Then, the second glass frit paste was coated on the network of reliefs by means of a screen printing method. The solvent was evaporated by drying the coated paste in an oven at 150° C. for about 20 minutes. Subsequently, ethyl cellulose contained in the dried paste was removed by keeping the dried paste in an oven at a temperature of 150° C. for about 10 minutes.

The dried second glass frit layer was sintered at a temperature of 545° C. in an IR furnace for about 10 minutes to form a flattening layer. The glass frit layer may be heated to remove ethyl cellulose and sintered by a successive process using a roll hearth furnace (RHF) or using separate ovens. The flattening layer prepared had a refractive index of about 1.9.

The roughness profile of the network of reliefs once covered by the flattening layer could be analyzed through a SEM cross-section-image-analysis between the network of reliefs and the flattening layer.

Comparative Example 1

Preparation of a Laminate for a Light Emitting Device

An internal light extraction layer was formed according to the procedure of Example 1, except that porous glass frit structures were formed at a lower sintering temperature (i.e., a temperature not more than 550° C.) (FIG. 5a).

Comparative Example 2

Preparation of a Laminate for a Light Emitting Device

An internal light extraction layer was formed according to the procedure of Example 1, except that the first glass frit was flattened by sintering at a higher sintering temperature (i.e., a temperature of 590° C. or more) (FIG. 5c).

When a sintering temperature T1 of the first glass frit layer was not more than 550° C. (FIG. 5a), bubbles were generated in a large amount, and reliefs were not formed.

When a sintering temperature T1 of the first glass frit layer was not less than 590° C. (FIG. 5c), the reliefs were deformed to become flat. Thus, when the sintering temperature T1 of the first glass frit layer was within a range from 550 to 590° C., preferably from 560 to 580° C. (FIG. 5b), bubbling inside the first glass frit layer was inhibited, and the intended reliefs were obtained. Further, a laminate for a light emitting device having reliefs with a stable shape were maintained during the sintering process of the flattening layer.

Comparative Example 3

Preparation of a Laminate for a Light Emitting Device

An internal light extraction layer was formed according to the procedure of Example 1, except that the thickness of the flattening layer was increased to 30 μm or more.

TABLE 1

The result of total luminous transmittance (%) was measured by ASTM D 1003 for laminates for the light emitting device of Example 1, Comparative Example 1 and Comparative Example 3.

| Standard for measurement: ASTM D 1003 | Example 1 | Comp. Example 1 | Comp. Example 3 |
|---|---|---|---|
| Total Thickness (μm) | 13.1 | 11.3 | 47.6 |
| Total Luminous Transmittance (%) | 73.1 | 64.1 | 63.5 |
| Percent Haze (%) | 72.8 | 83.7 | 82.0 |

Comparative Example 3 had a thicker flattening layer compared to Example 1. Even though the reliefs of Example 1 and Comparative Example 3 had similar average thicknesses, the results in Comparative Example 3 was poor due to increase of light loss, which occurs by the increased light paths as the thickness of the flattening layer increases.

On the other hand, although the total thickness of Comparative Example 1 was lower than that of Example 1, total luminous transmittance of Comparative Example 1 was lower than that of Example 1. This is because air bubbles, which induce light loss since they increase light paths, were generated in a large amount from voids between agglomerates.

The total luminous transmittance of Example 1 was the highest among the three samples.

Figure 7:
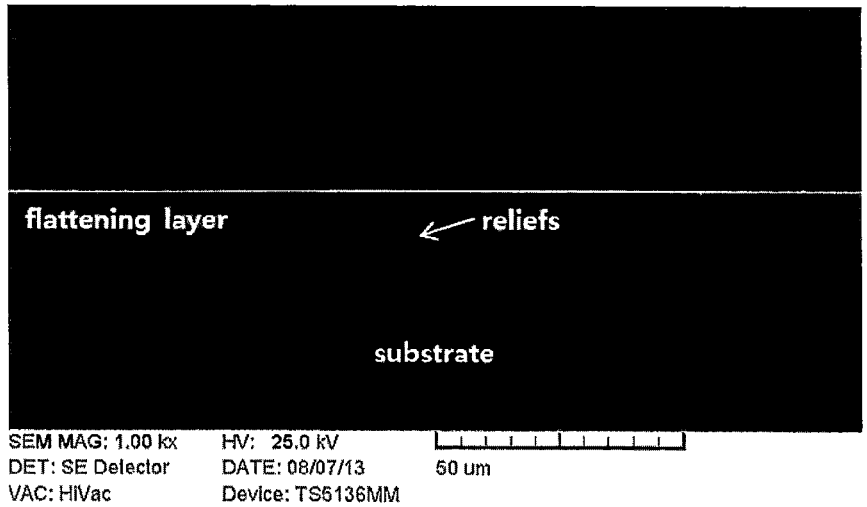
FIGS. 7a and 7b shows SEM photographs of an internal light extraction layer prepared according to Example 1 (FIG. 7a) and Comparative Example 2 (FIG. 7b).
Figure 7:
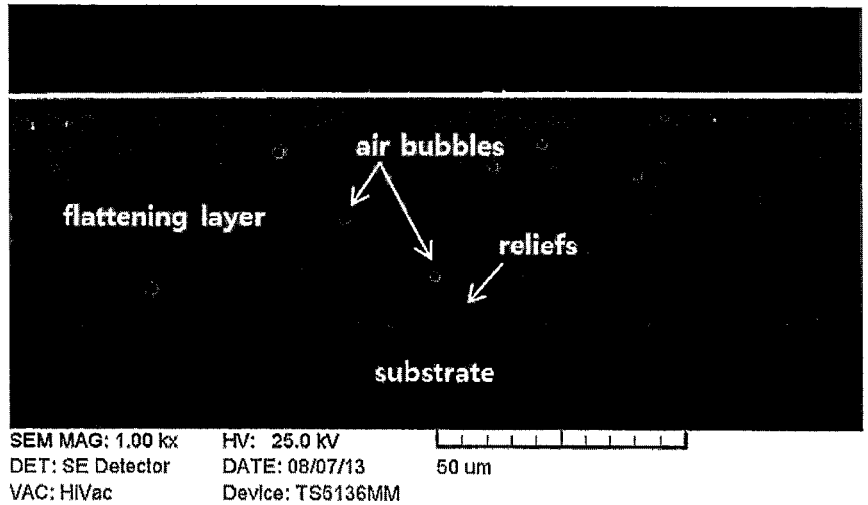

FIG. 7 shows SEM photographs of an internal light extraction layer prepared according to the procedure of Example 1 (FIG. 7a) and Comparative Example 3 (FIG. 7b).

In FIG. 7b, many air bubbles exist inside the flattening layer generated during the sintering process. The concentration of captured air bubbles increases according to the increase of the thickness of the flattening layer. Thus, there is a substantial risk of bubble deficiency on the surface of an internal light extraction layer, which can induce a short circuit between electrodes. The air bubbles also lead to reduction of total luminerous transmittance due to an increase of light path. Further, if the thickness of the second glass frit paste layer increases, the process time for forming (sintering) the flattening layer increases, which is economically disadvantages.

Figure 8:
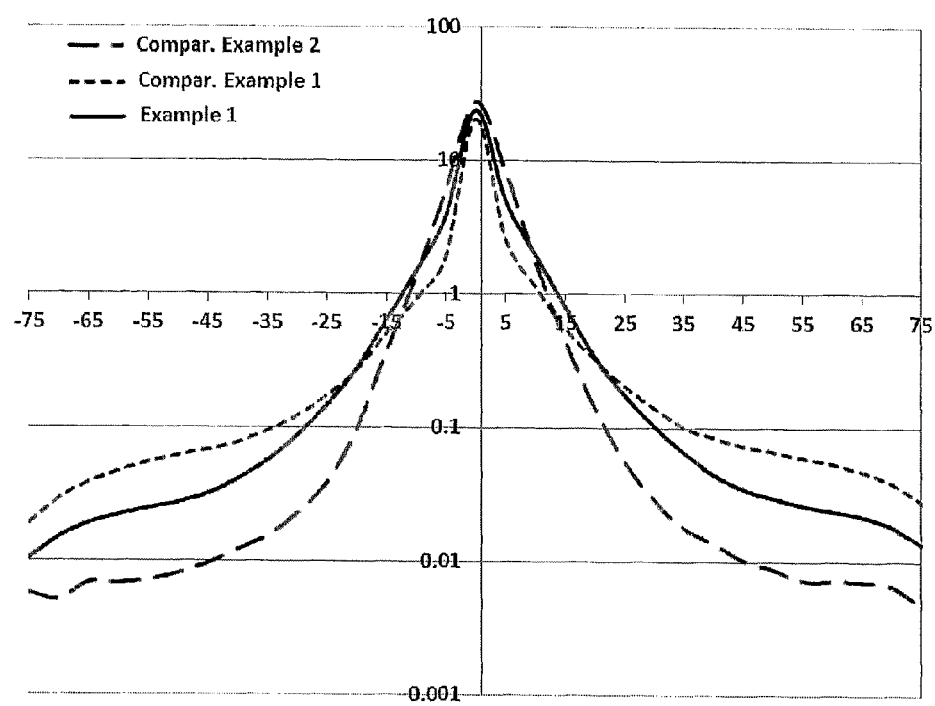
FIG. 8 is a graph showing an intensity distribution of externally emitted light with respect to a viewing angle, measured with the laminates of Comparative Example 1, Comparative Example 3 and Example 1.

Evaluation of Optical Characteristics of the Laminates for a Light Emitting Device FIG. 8 is a graph showing the intensity distribution of externally emitted light with respect to a viewing angle. GONIOPHOTOMETER GP-11R manufactured by Murakami Color Research Laboratory Co. was used for the measurement. The laminate for a light emitting device according to the present invention (Example 1) exhibits good intensity as compared to that of Comparative Example 1 at a viewing angle between −20° and 20°, since the laminate according to the invention can form many prominent structures. Further, the laminate of Example 1 exhibits good intensity as compared to that of Comparative Example 3 at a viewing angle between −20° and 20°, since the laminate according to the invention has excellent light diffusive performance.

To summarize, the laminate for a light emitting device according to the present invention which comprises a random network of reliefs of low refractive index advantageously exhibits excellent light diffusive performance and superior optical transmittance in a perpendicular direction.

A laminate for a light emitting device of the present invention can be widely used for light emitting devices requiring efficient extraction of light, being particularly suitable in the industrial fields of optical devices, such as organic light emitting diodes (OLEDs), backlights, and lighting, due to its superior optical characteristics.

<Symbols>
a: a total thickness of a random network of reliefs and a flattening layer
a': an average total thickness of a random network of reliefs and a flattening layer
b: a height of a relief
b': an average height of reliefs
c: a pitch between reliefs
c': an average pitch between reliefs
r: a ratio of b' to c'
d: a thickness of a flattening layer

What is claimed:

1. A laminate for a light emitting device, comprising:
   a glass substrate having a refractive index n1 from 1.45 to 1.65;
   a random network of reliefs made of enamel, formed on the glass substrate, said network having a refractive index n2 ranging from 1.45 to 1.65; and
   a flattening layer made of enamel, formed on said network and said glass substrate, said flattening layer having a refractive index n3 ranging from 1.8 to 2.1;
   wherein at least 50%, of said reliefs show a cross section having:
   a height (b) ranging from 1 to 10 μm, and
   a width ranging from 2 to 40 μm; and
   wherein at least 50%, of pitches (c) of said network are in the range from 2 μm to 15 μm.

2. The laminate of claim 1, wherein the network shows a roughness profile of Ra, being an arithmetical mean deviation of the roughness profile, ranging from 0.3 μm to 3 μm; Ry, being a maximum height of the roughness profile, ranging from 1 μm to 10 μm; and S, being a mean spacing of local peaks, ranging from 2 μm to 40 μm.

3. The laminate of claim 1, wherein a ratio (r) of an average height (b') of the reliefs to an average pitch (c') of the reliefs is from 0.1 to 0.5.

4. The laminate of claim 1, wherein the proportion of area where said network covers said glass substrate is 60 to 90%.

5. The laminate of claim 1, wherein the reliefs comprises hillocks and/or clusters of hillocks.

6. The laminate of claim 1, wherein an average total thickness (a') of the network and the flattening layer ranges from 6 to 20 μm.

7. The laminate of claim 1, wherein a thickness of the flattening layer (d) is less than 20 μm.

8. The laminate of claim 1, wherein a roughness Ra measured at the surface of the flattening layer is not more than 1 nm.

9. The laminate of claim 1, wherein said network is formed from a first glass frit, and the first glass frit comprises 10% to 40% by weight of $SiO_2$, 1% to 7% by weight of $Al_2O_3$, 0% to 10% by weight of $P_2O_5$, 20% to 50% by weight of $B_2O_3$, 3% to 35% by weight of ZnO, and 5% to 20% by weight of at least one alkaline metal oxide(s) selected from the group consisting of $Na_2O$, $Li_2O$ and $K_2O$, based on the total weight of the first glass frit after formation of said network.

10. The laminate of claim 1, wherein the flattening layer is formed from a second glass frit, and the second glass frit comprises 55% to 84% by weight of $Bi_2O_3$, 0% to 20% by weight of BaO, 5% to 20% by weight of ZnO, 1% to 7% by weight of $Al_2O_3$, 5% to 15% by weight of $SiO_2$, 5% to 20% by weight of $B_2O_3$, 0 to 0.1% by weight of $CeO_2$, 0.05 to 5% by weight of $Na_2O$ and less than 5% by weight of one or more compounds selected from the group consisting of $TiO_2$, $ZrO_2$, $La_2O_3$, $Nb_2O_3$ and MgO, based on the total weight of the second glass fit after formation of said flattening layer.

11. The laminate of claim 1, wherein the glass substrate is a sodalime glass substrate.

12. The laminate of claim 1, wherein the laminate shows a haze ratio of at least 70% and a total luminous transmittance of at least 65%.

13. The laminate of claim 1, further comprising a transparent electrode on the flattening layer.

14. A light emitting device comprising the laminate according to claim 1.

15. A process for preparing a laminate for a light emitting device, comprising the steps of:
(a) providing a glass substrate having a refractive index n1 from 1.45 to 1.65;
(b-1) forming a first glass frit paste layer by applying a first glass frit paste, comprising an organic solvent and a first glass frit powder, on said glass substrate, wherein the first glass frit powder is comprised in an amount of 50% by weight or less based on the total weight of the first glass frit paste, and said first paste layer covers a given area of said glass substrate;
(b-2) removing the organic solvent by drying the applied first glass frit paste layer;
(b-3) forming a random network of reliefs by sintering the dried first glass frit layer at a sintering temperature T1 to give partial agglomeration or densification of the first glass frit powder;
(c-1) forming a second glass frit paste layer by applying a second glass frit paste, comprising an organic solvent and a second glass frit powder, on said network;
(c-2) removing the organic solvent by drying the applied second glass frit layer; and
(c-3) forming a flattening layer by sintering the dried second glass frit layer at a sintering temperature T2;
wherein at least 50%, of said reliefs show a cross-section having:
a height (b) ranging from 1 to 10 μm, and
a width ranging from 2 to 40 μm; and
wherein at least 50%, of pitches (c) of said network are in the range from 2 μm to 15 μm.

16. The process of claim 15, wherein the first glass frit powder is comprised in an amount from 10% to 50% by weight based on the total weight of the first glass frit paste.

17. The process of claim 15, wherein the sintering temperature T1 in step (b-3) is 60 to 110° C. higher than the glass transition temperature of the first glass frit.

18. The process of claim 15, wherein the sintering temperature T1 in step (b-3) ranges from 550 to 590° C., and the sintering temperature T2 in step (c-3) is the same or lower than T1.

19. The process of claim 15, wherein any additional patterning process such as lithography or imprinting is not involved in steps (b-1) to (b-3).

20. The process of claim 15, wherein a ratio (r) of an average height (b') of the reliefs to an average pitch (c') of the reliefs is from 0.1 to 0.5.

21. The process of claim 15, wherein an average total thickness (a') of the network and the flattening layer ranges from 6 to 20 μm.

22. The process of claim 15, wherein a thickness of the flattening layer (d) is less than 20 μm.

23. The process of claim 15, wherein the first glass frit powder comprises 10% to 40% by weight of $SiO_2$, 1% to 7% by weight of $Al_2O_3$, 0% to 10% by weight of $P_2O_5$, 20% to 50% by weight of $B_2O_3$, 3% to 35% by weight of ZnO, and 5% to 20% by weight of at least one alkaline metal oxide(s) selected from the group consisting of $Na_2O$, $Li_2O$ and $K_2O$, based on the total weight of the first glass frit after formation of said network.

24. The process of claim 15, wherein the second glass frit powder comprises 55% to 84% by weight of $Bi_2O_3$, 0% to 20% by weight of BaO, 5% to 20% by weight of ZnO, 1% to 7% by weight of $Al_2O_3$, 5% to 15% by weight of $SiO_2$, 5% to 20% by weight of $B_2O_3$, 0 to 0.1% by weight of $CeO_2$, 0.05 to 5% by weight of $Na_2O$ and less than 5% by weight of one or more compounds selected from the group consisting of $TiO_2$, $ZrO_2$, $La_2O_3$, $Nb_2O_3$ and MgO, based on the total weight of the second glass frit after formation of said flattening layer.

25. The process of claim 15, wherein the glass substrate is a sodalime glass substrate.

26. The laminate of claim 1, wherein the flattening layer further comprises voids.

27. The laminate of claim 13, wherein the transparent electrode is selected from the group consisting of inorganic conductive materials such as indium tin oxide (ITO), doped $SnO_2$, indium zinc oxide (IZO), doped zinc oxide (ZnO) such as aluminium doped zinc oxide (AZO) or gallium doped zinc oxide (GZO), and graphine, and organic conductive materials such as polyethylene dioxythiophene doped with polystyrene sulfonic acid (PSS) (PEDOT:PSS) and phthalocyanines such as copper phthalocyanine (CuPc), wherein the transparent electrode may comprise a metal grid.

28. The laminate of claim 1, further comprising a barrier layer comprising one or more layers selected from the group consisting of $SiO_2$ layer, SiON layer, $Si_3N_4$ layer, $TiO_2$ layer $Al_2O_3$ layer and $TiO_2$—$Al_2O_3$ alloy layer, between the internal light extraction layer and the electrode.

\* \* \* \* \*